United States Patent
Chang

(10) Patent No.: US 10,516,861 B2
(45) Date of Patent: Dec. 24, 2019

(54) IMAGE SENSOR FOR IMPROVING DEPTH OF FIELD OF IMAGE, AND METHOD FOR OPERATING SAME

(71) Applicant: CENTER FOR INTEGRATED SMART SENSORS FOUNDATION, Daejeon (KR)

(72) Inventor: Seung Hyuk Chang, Seoul (KR)

(73) Assignee: CENTER FOR INTEGRATED SMART SENSORS FOUNDATION, Daejeon (KR)

( * ) Notice: Subject to any disclaimer, the term of this patent is extended or adjusted under 35 U.S.C. 154(b) by 44 days.

(21) Appl. No.: 15/574,399

(22) PCT Filed: May 15, 2015

(86) PCT No.: PCT/KR2015/004922
§ 371 (c)(1),
(2) Date: Nov. 15, 2017

(87) PCT Pub. No.: WO2016/186222
PCT Pub. Date: Nov. 24, 2016

(65) Prior Publication Data
US 2018/0139417 A1    May 17, 2018

(51) Int. Cl.
*H04N 5/232* (2006.01)
*H04N 5/369* (2011.01)
(Continued)

(52) U.S. Cl.
CPC ........... *H04N 9/083* (2013.01); *H01L 27/146* (2013.01); *H01L 27/14621* (2013.01);
(Continued)

(58) Field of Classification Search
CPC ......... H04N 5/23212; H04N 5/232125; H04N 5/23219; H04N 5/3696; H04N 5/36961;
(Continued)

(56) References Cited

U.S. PATENT DOCUMENTS

| 6,829,008 B1* | 12/2004 | Kondo | ..................... G02B 7/34 |
| | | | 348/302 |
| 2012/0113300 A1* | 5/2012 | Hamano | ................ G02B 7/346 |
| | | | 348/241 |
| 2015/0098005 A1* | 4/2015 | Tsai | .................... H04N 5/23212 |
| | | | 348/336 |

FOREIGN PATENT DOCUMENTS

| JP | 2000-156823 A | 6/2000 |
| JP | 2012-100130 A | 5/2012 |

(Continued)

OTHER PUBLICATIONS

International Search Report for PCT/KR2015/004922 dated Feb. 12, 2016.
(Continued)

*Primary Examiner* — Nelson D. Hernández Hernández
(74) *Attorney, Agent, or Firm* — Hauptman Ham, LLP

(57) ABSTRACT

An image sensor included in a camera system comprises: a plurality of photodiodes for processing optical signals which have passed through a lens included in the camera system; and at least one mask, disposed on the top of at least one photodiode among the plurality of photodiodes, for enabling the optical signals which have passed through an inner region of the lens included in the camera system to enter the at least one photodiode.

15 Claims, 6 Drawing Sheets

(51) Int. Cl.
    *H01L 27/146*     (2006.01)
    *H04N 9/04*     (2006.01)
    *H04N 5/222*     (2006.01)
    *H04N 9/083*     (2006.01)
    *H04N 5/225*     (2006.01)

(52) U.S. Cl.
    CPC .. *H01L 27/14623* (2013.01); *H01L 27/14627* (2013.01); *H04N 5/23212* (2013.01); *H04N 5/23229* (2013.01); *H04N 5/3696* (2013.01); *H04N 9/04551* (2018.08); *H04N 5/2226* (2013.01); *H04N 5/2254* (2013.01)

(58) Field of Classification Search
    CPC .......... H04N 5/36965; H01L 27/14623; H01L 27/14627
    See application file for complete search history.

(56) References Cited

FOREIGN PATENT DOCUMENTS

| | | |
|---|---|---|
| KR | 10-0731135 B1 | 6/2007 |
| KR | 10-2007-0071206 A | 7/2007 |
| KR | 10-0825805 B1 | 4/2008 |
| KR | 10-2009-0064991 A | 6/2009 |
| KR | 10-2010-0080230 A | 7/2010 |

OTHER PUBLICATIONS

Written Opinion for PCT/KR2015/004922 dated Feb. 12, 2016.
Korean Office Action dated Apr. 17, 2019, in connection with the Korean Patent Application No. 10-2017-7030278.

\* cited by examiner under 35 U.S.C § 371 of PCT application number PCT/KR2015/004922 filed on May 15, 2015. The disclosures of the above-listed applications are hereby incorporated by reference herein in their entirety.

IMAGE SENSOR FOR IMPROVING DEPTH OF FIELD OF IMAGE, AND METHOD FOR OPERATING SAME

CROSS REFERENCE TO RELATED APPLICATION

This present application is a national stage filing under 35 U.S.C § 371 of PCT application number PCT/KR2015/004922 filed on May 15, 2015. The disclosures of the above-listed applications are hereby incorporated by reference herein in their entirety.

TECHNICAL FIELD

The present disclosure relates to an image sensor included in a camera system, and more particularly, relates to technologies for an image sensor for enhancing a depth of field (DOF) of an image by changing a physical structure.

BACKGROUND ART

As a camera system including a conventional image sensor includes two different apertures, it may allow the image sensor to generate an image with an excessive blur and a clear image using the two different apertures. For example, a conventional camera system may generate an image with an excessive blur using a basic aperture and may generate a clear image using an additional small aperture.

Thus, the conventional camera system may enhance a DOF of an image by obtaining the clear image using the same aperture.

However, since the conventional camera system uses the additional small aperture, additional cost and a manufacturing process may be needed. As the small aperture receives an insufficient amount of light during a limited exposure time, a noise is excessive in an image generated using the small aperture.

Thus, in the specification, technology of enhancing a DOF of an image in the image sensor itself rather than using the small aperture is proposed.

DETAILED DESCRIPTION OF THE INVENTION

Technical Problem

An aspect of the present disclosure is to provide a technology for enhancing a DOF of an image by changing a physical structure of an image sensor rather than using a small aperture in a camera system.

In detail, another aspect of the present disclosure is to provide an image sensor for enhancing a DOF of an image by including at least one mask disposed on an upper portion of at least one of a plurality of photodiodes.

Further, another aspect of the present disclosure is to provide a camera system having an auto focusing function by including at least one mask.

Technical Solution

In accordance with an aspect of the present disclosure, an image sensor included in a camera system is provided. The image sensor may include a plurality of photodiodes, each being configured to process an optical signal passing through a lens included in the camera system and at least one mask configured to be located on an upper portion of at least one photodiode among the plurality of photodiodes and introduce the optical signal passing through an inner region of the lens included in the camera system into the at least one photodiode.

The at least one mask may block the optical signal passing through an outer region of the lens included in the camera system from being introduced into the at least one photodiode.

The at least one mask may be formed such that a masked region covers a region which is not masked.

The region which is not masked in the at least one mask may be formed to have one of a circle, a triangle, a quadrangle, or a polygon.

The at least one photodiode on which the at least one mask is disposed may generate a clearer image than images generated by the other photodiodes except for the at least one photodiode among the plurality of photodiodes.

The at least one mask may be formed such that a central location of a region which is not masked in the at least one mask is misaligned with a central location of the at least one photodiode.

The image sensor may perform at least one of auto focusing or depth estimation using an image generated by the at least one photodiode on which the at least one mask is disposed and images generated by the other photodiodes except for the at least one photodiode among the plurality of photodiodes.

The image sensor may further include a plurality of color filters configured to be disposed on an upper portion of the plurality of photodiodes and filter the optical signal passing through the lens included in the camera system.

The plurality of color filters may include at least one of a red-green-blue (RGB) color filter, a white color filter, or an infrared (IR) color filter.

At least one color filter disposed on an upper portion of the at least one mask among the plurality of color filters may be at least one white color filter.

The image sensor may further include a plurality of microlenses, each being configured to be disposed on an upper portion of each of the plurality of color filters and move the optical signal passing through the lens included in the camera system ahead to each of the plurality of color filters.

In accordance with another aspect of the present disclosure, an operation method of an image sensor included in a camera system is provided. The method may include introducing an optical signal passing through an inner region of a lens included in the camera system into at least one photodiode using at least one mask disposed on an upper portion of the at least one photodiode among a plurality of photodiodes, introducing an optical signal passing through the lens included in the camera system into the other photodiodes except for the at least one photodiode among the plurality of photodiodes, processing, by the at least one photodiode, the optical signal passing through the inner region of the lens included in the camera system, and processing, by the other photodiodes except for the at least one photodiode among the plurality of photodiodes, the optical signal passing through the lens included in the camera system.

The introducing of the optical signal passing through the inner region of the lens included in the camera system into the at least one photodiode may include blocking, by at least one mask, the optical signal passing through an outer region of the lens included in the camera system from being introduced into the at least one photodiode.

The at least one mask may be formed such that a masked region covers a region which is not masked.

The region which is not masked in the at least one mask may be formed to have one of a circle, a triangle, a quadrangle, or a polygon.

In accordance with another aspect of the present disclosure, a camera system is provided. The camera system may include a lens configured to introduce an optical signal and an image sensor. The image sensor may include a plurality of photodiodes, each being configured to process an optical signal passing through the lens and at least one mask configured to be located on an upper portion of at least one photodiode among the plurality of photodiodes and introduce the optical signal passing through an inner region of the lens into the at least one photodiode.

Advantageous Effects of the Invention

Embodiments of the present disclosure may provide technology for enhancing a DOF of an image by changing a physical structure of an image sensor rather than using a small aperture in a camera system.

In detail, embodiments of the present disclosure may provide an image sensor for enhancing a DOF of an image by including at least one mask disposed on an upper portion of at least one of a plurality of photodiodes.

Further, embodiments of the present disclosure may provide a camera system having an auto focusing function by including at least one mask.

BEST MODE

Figure 1:
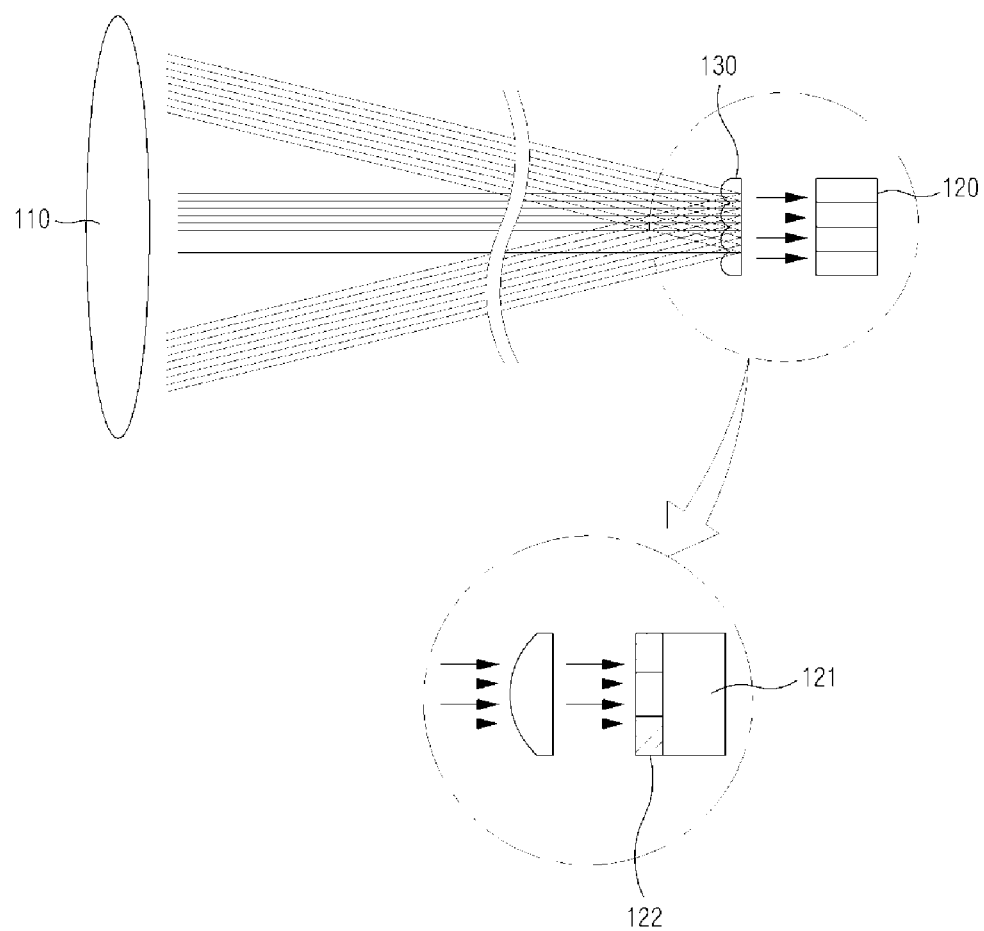
FIG. 1 is a drawing illustrating a principle for enhancing a DOF of an image according to an embodiment of the present disclosure.

Hereinafter, a description will be given in detail of embodiments with reference to the accompanying drawings. However, the present disclosure is restricted or limited to embodiments of the present disclosure. Further, like reference numerals shown in each drawing indicates like members.

Further, the terminology used in the specification may be terms used to properly represent an exemplary embodiment of the present disclosure and may vary according to intention of a user or an operator or custom of a field included in the present disclosure. Therefore, the terminology will be defined based on contents across the specification.

FIG. 1 is a drawing illustrating a principle for enhancing a DOF of an image according to an embodiment of the present disclosure.

Referring to FIG. 1, in a camera system according to an embodiment of the present disclosure, an optical signal passing through a lens 110 included in the camera system may be introduced into a plurality of photodiodes 120.

In this case, a plurality of microlenses 130 may be disposed on an upper portion of the plurality of photodiodes 120 and may move the optical signal passing through the lens 110 ahead to each of the plurality of photodiodes 120. Herein, the plurality of microlenses 130 may be implemented in the form of an array.

Thus, the optical signal passing through an inner region of the lens 110 may be introduced into an inner region of each of the plurality of photodiodes 120. The optical signal passing through an outer region of the lens 110 may be introduced into an outer region of each of the plurality of photodiodes 120.

Herein, an image generated after each of the plurality of photodiodes 120 processes the optical signal passing through the inner region of the lens 110 is clearer than an image generated after each of the plurality of photodiodes 120 processes the optical signal passing through the outer region of the lens 110. Thus, as at least one mask 122 which introduces the optical signal passing through the inner region of the lens 110 is disposed on an upper portion of at least one photodiode 121 among the plurality of photodiodes 120, the camera system according to an embodiment of the present disclosure may generate an image having an enhanced DOF using the at least one photodiode 121. A detailed description for this will be described hereafter.

Figure 2:
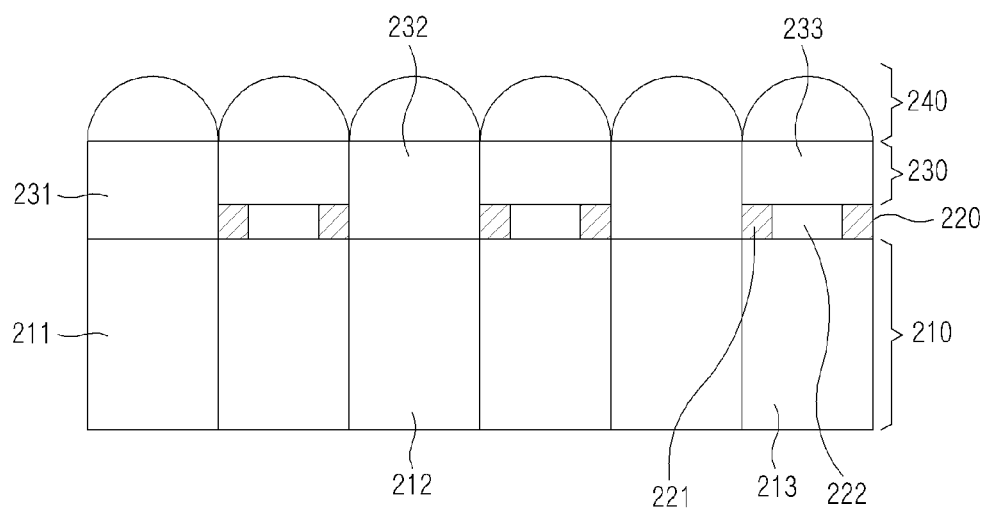
FIG. 2 is a side view illustrating an image sensor according to an embodiment of the present disclosure.

FIG. 2 is a side view illustrating an image sensor according to an embodiment of the present disclosure.

Referring to FIG. 2, the image sensor according to an embodiment of the present disclosure may include a plurality of photodiodes 210, at least one mask 220, a plurality of color filters 230, and a plurality of microlenses 240.

The plurality of microlenses 240 may be located on an upper portion of the plurality of color filters 230 and may move an optical signal passing through a lens included in the camera system ahead to each of the plurality of color filters 230. In this case, the plurality of microlenses 240 may be implemented in the form of an array.

The plurality of color filters 230 may be disposed on a lower portion of the plurality of microlenses 240 and on an upper portion of the plurality of photodiodes 210 and may filter the optical signal passing through the lens included in the camera system.

Herein, each of the plurality of color filters 230 may filter each of the other optical signals except for a specific optical signal distinguished from the other optical signals. For example, a first color filter 231 among the plurality of color filters 230 may selectively introduces a red (R) optical signal into a first photodiode 211 among the plurality of photodiodes 210 by filtering the other optical signals except for the R optical signal. A second color filter 232 may selectively introduce a green (G) optical signal into a second photodiode 212 among the plurality of photodiodes 210 by filtering the other optical signals except for the G optical signal.

In this case, at least one of a red-green-blue (RGB) color filter, a white color filter, or an infrared (IR) color filter may be used as the plurality of color filters 230. Particularly, a white color filter which selectively introduces a white optical signal may be used as at least one color filter 233 disposed on an upper portion of the at least one mask 220 among the plurality of color filters 230.

Each of the plurality of photodiodes 210 may process an optical signal passing through the lens included in the camera system. For example, each of the plurality of photodiodes 210 may process an optical signal generated after the optical signal passing through the lens included in the camera system is filtered by each of the plurality of color filters 230.

The at least one mask 220 may be disposed on an upper portion of at least one photodiode 213 among the plurality of photodiodes 210 and may introduce an optical signal passing through an inner region of the lens included in the camera system into the at least one photodiode 213. For example, the at least one mask 220 may introduce the optical signal passing through the inner region of the lens included in the camera system among optical signals filtered by at least one color filter 233 disposed on an upper portion of the at least one mask 220 into the at least one photodiode 213.

Herein, the at least one mask 220 may block an optical signal passing through an outer region of the lens included in the camera system from being introduced into the at least one photodiode 213. Thus, since an image generated by the at least one photodiode 213 on which the at least one mask 220 is disposed is generated by processing only an optical signal passing through the inner region of the lens included in the camera system, it may be an image with an enhanced DOF (the image generated by the at least one photodiode 213 on which the at least one mask 220 is disposed may be clearer than images generated by the other photodiodes (on which the at least one mask 220 is not disposed) except for the at least one photodiode 213 among the plurality of photodiodes 210).

The at least one mask 220 may be formed such that masked regions 221 covers a region 222 which is not masked. Further, the region 222 which is not masked in the at least one mask 220 may be formed to have one of a circle, a triangle, a quadrangle, or a polygon. A detailed description for this will be given with reference to FIG. 3.

Figure 3:
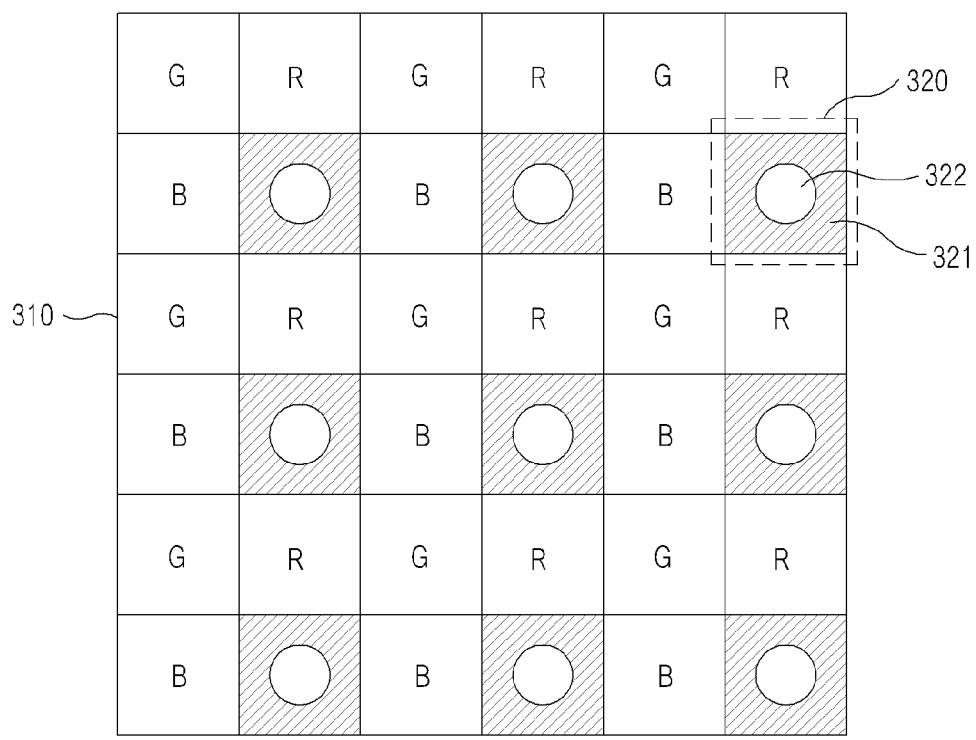
FIG. 3 is a top view illustrating an image sensor for describing at least one mask shown in FIG. 2 according to an embodiment of the present disclosure.

FIG. 3 is a top view illustrating an image sensor for describing at least one mask shown in FIG. 2 according to an embodiment of the present disclosure. Hereinafter, a description will be given of an example in which a plurality of microlenses included in an image sensor is omitted to describe the at least one mask and in which a plurality of color filters are disposed on an upper portion of a plurality of photodiodes 310 and introduce a specific optical signal into each of the plurality of photodiodes 310.

Referring to FIG. 3, at least one mask 320 included in the image sensor according to an embodiment of the present disclosure may be located on an upper portion of at least one photodiode among the plurality of photodiodes 310. In this case, in the drawing, an embodiment is exemplified as the at least one mask 320 is regularly disposed on an upper portion of the at least one photodiode among the plurality of photodiodes 310. However, embodiments are not limited thereto. For example, the at least one mask 320 may irregularly disposed on an upper portion of the at least one photodiode among the plurality of photodiodes 310.

Herein, as the at least one mask 320 is formed such that a masked region 321 covers a region 322 which is not masked, it may block an optical signal passing through an outer region of a lens included in a camera system in an optical signal introduced into the at least one mask 320 and may introduce only an optical signal passing through an inner region of the lens included in the camera system.

In this case, the region 322 which is not masked in the at least one mask 320 may be formed to have one of a circle, a triangle, a quadrangle, or a polygon by the masked region 321.

Further, although not illustrated in FIG. 3, the at least one mask 320 may be formed such that a central location of the region 322 which is not masked is misaligned with a central location of the at least one photodiode on which the at least one mask 320 is disposed.

In this case, an image generated after the at least one photodiode on which the at least one mask 320 is disposed processes an optical signal introduced by the at least one mask 320 may be used in an auto focusing process, a depth estimation process, or the like by being compared with images generated by the other photodiodes except for the at least one photodiode on which the at least one mask 320 is disposed among the a plurality of photodiodes 310.

Thus, the image sensor including the at least one mask 320 formed such that the central location of the region 322 which is not masked is misaligned with the central location of the at least one photodiode on which the at least one mask 320 is disposed may have an auto focusing function and/or a depth estimation function. A detailed description for this will be omitted because of departing from the scope and spirit of the present disclosure.

Further, as the image sensor allows the at least one photodiode on which the at least one mask 320 is disposed to process an optical signal of the same wavelength with one of the other photodiodes on which the at least one mask 320 is not disposed (e.g., as the image sensor allows all of the at least one photodiode on which the at least one mask 320 is disposed and one of the other photodiodes on which the at least one mask 320 is not disposed to process a G signal), it may merge an image generated by the at least one photodiode on which the at least one mask 320 is disposed with an image generated by one of the other photodiodes on which the at least one mask 320 is not disposed to generate a wide dynamic range image.

Figure 4:
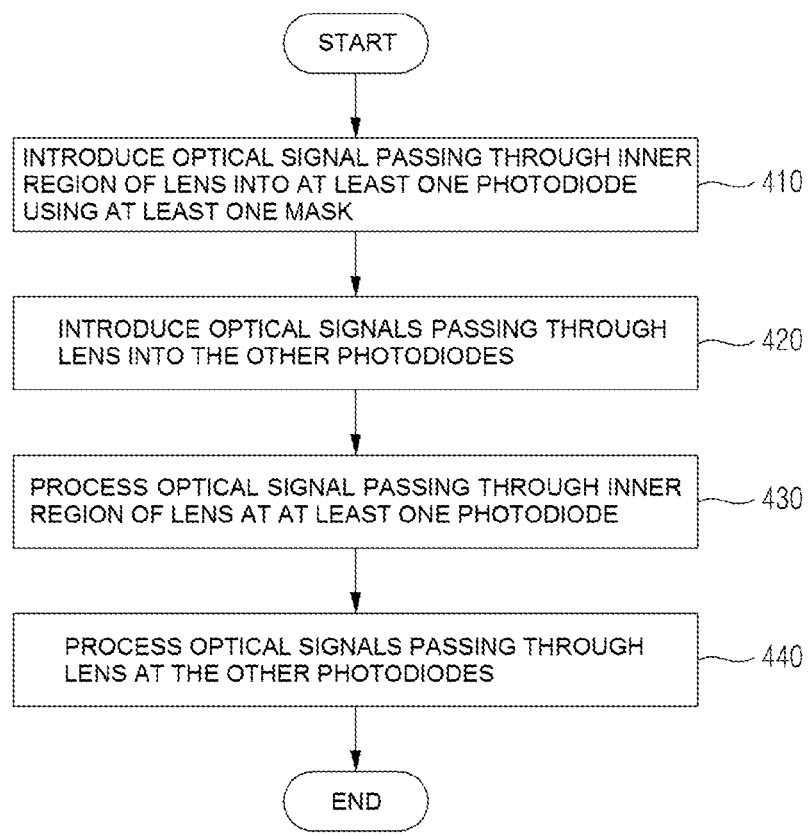
FIG. 4 is a flowchart illustrating an operation method of an image sensor according to an embodiment of the present disclosure.

FIG. 4 is a flowchart illustrating an operation method of an image sensor according to an embodiment of the present disclosure.

Referring to FIG. 4, in operation 410, the image sensor according to an embodiment of the present disclosure may introduce an optical signal passing through an inner region of a lens included in a camera system into at least one photodiode using at least one mask disposed on an upper portion of the at least one photodiode among a plurality of photodiodes.

Further, in operation 420, the image sensor may introduce the optical signal passing through the lens included in the camera system into the other photodiodes except for the at least one photodiode among the plurality of photodiodes.

In operation 430, the at least one photodiode on which the at least one mask is disposed may process the optical signal passing through the inner region of the lens included in the camera system.

In operation 440, the other photodiodes except for the at least one photodiode on which the at least one mask is disposed among the plurality of photodiodes may process the optical signal passing through the lens included in the camera system.

As such, the image sensor according to an embodiment of the present disclosure may generate an image with an enhanced DOF by introducing the optical signal passing through the inner region of the lens included in the camera system into the at least one photodiode using the at least one mask in operation 410 and processing only the optical signal passing through the inner region of the lens included in the camera system in operation 430.

For example, the at least one photodiode on which the at least one mask is disposed in the image sensor may generate a clearer image than images generated by the other photodiodes except for the at least one photodiode among the plurality of photodiodes.

Further, although not illustrated in FIG. 4, since the at least one mask is formed such that a central location of a region which is not masked in the at least one mask is misaligned with a central location of the at least one photodiode, the image sensor may perform at least one of auto focusing or depth estimation using an image generated by the at least one photodiode on which the at least one mask is disposed and images generated by the other photodiodes except for the at least one photodiode among the plurality of photodiodes.

Figure 5:
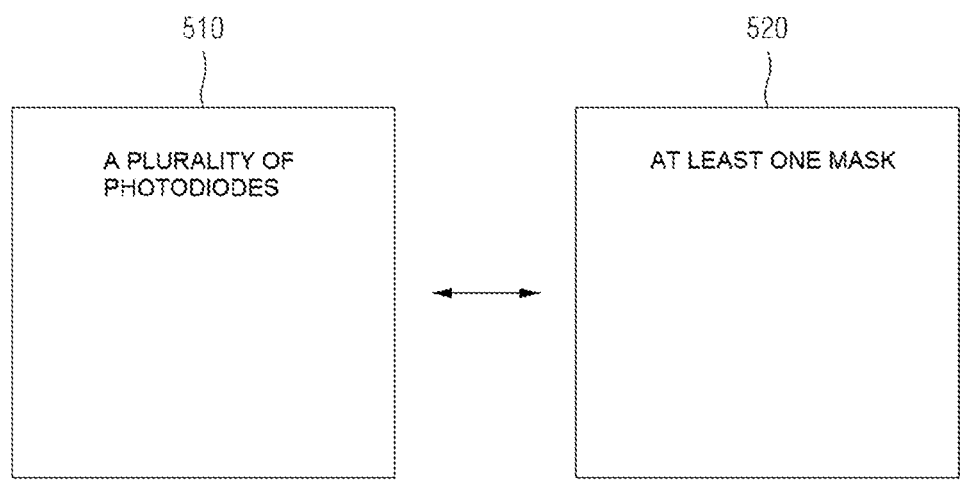
FIG. 5 is a block diagram illustrating an image sensor according to an embodiment of the present disclosure.

FIG. 5 is a block diagram illustrating an image sensor according to an embodiment of the present disclosure.

Referring to FIG. 5, the image sensor according to an embodiment of the present disclosure may include a plurality of photodiodes 510 and at least one mask 520.

Each of the plurality of photodiodes 510 may process an optical signal passing through a lens included in a camera system.

The at least one mask 520 may be located on an upper portion of at least one photodiode among the plurality of photodiodes 510 and may introduce an optical signal passing through an inner region of the lens included in the camera system into the at least one photodiode.

In this case, the at least one mask 520 may block an optical signal passing through an outer region of the lens included in the camera system from being introduced into the at least one photodiode.

Further, the at least one mask 520 may be formed such that a masked region covers a region which is not masked. Herein, the region which is not masked in the at least one mask 520 may be formed to have one of a circle, a triangle, a quadrangle, or a polygon.

Thus, the at least one photodiode on which the at least one mask 520 is disposed may generate a clearer image than images generated by the other photodiodes except for the at least one photodiode among the plurality of photodiodes.

Further, the at least one mask 520 may be formed such that a central location of the region which is not masked in the at least one mask 520 is misaligned with a central location of the at least one photodiode.

Thus, the image sensor may perform at least one of auto focusing or depth estimation using the image generated by the at least one photodiode on which the at least one mask 520 is disposed and the images generated by the other photodiodes except for the at least one photodiode among the plurality of photodiodes 510.

Although not illustrated in FIG. 5, the image sensor may further include a plurality of color filters. The plurality of color filters may be located on an upper portion of the plurality of photodiodes 510 and may filter an optical signal passing through the lens included in the camera system.

In this case, the plurality of color filters may include at least one of an RGB color filter, a white color filter, or an IR color filter. Particularly, at least one color filter disposed on an upper portion of the at least one mask 520 among the plurality of color filters may be at least one white color filter.

Further, although not illustrated in FIG. 5, the image sensor may further include a plurality of microlenses which are disposed on an upper portion of the plurality of color filters and move an optical signal passing through the lens included in the camera system ahead to each of the plurality of color filters.

Figure 6:
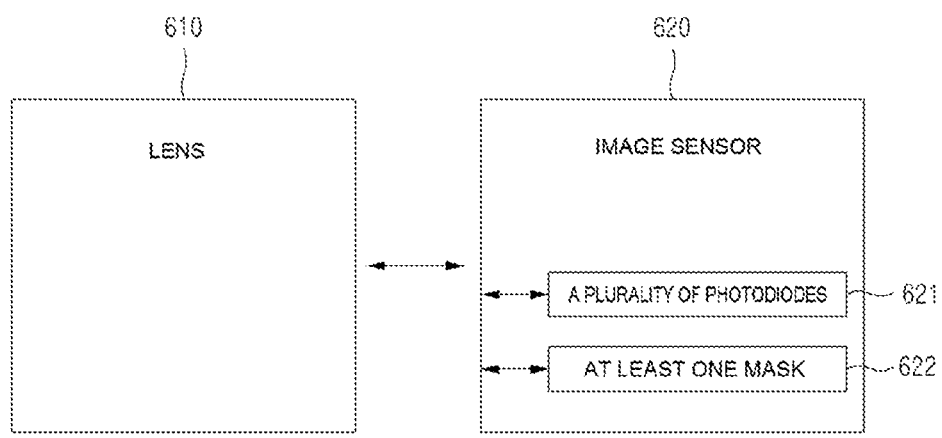
FIG. 6 is a block diagram illustrating a camera system according to an embodiment of the present disclosure.

FIG. 6 is a block diagram illustrating a camera system according to an embodiment of the present disclosure.

Referring to FIG. 6, the camera system according to an embodiment of the present disclosure may include a lens 610 for introducing an optical signal and an image sensor 620.

Herein, the image sensor 620 may include a plurality of photodiodes 621 and at least one mask 622.

Each of the plurality of photodiodes 621 may process an optical signal passing through the lens 610.

The at least one mask 622 may be located on an upper portion of at least one photodiode among the plurality of photodiodes 621 and may introduce an optical signal passing through an inner region of the lens 610 into the at least one photodiode.

In this case, the at least one mask 622 may block an optical signal passing through an outer region of the lens 610 from being introduced into the at least one photodiode.

Further, the at least one mask 622 may be formed such that a masked region covers a region which is not masked. Herein, the region which is not masked in the at least one mask 622 may be formed to have one of a circle, a triangle, a quadrangle, or a polygon.

Thus, the at least one photodiode on which the at least one mask 622 is disposed may generate a clearer image than images generated by the other photodiodes except for the at least one photodiode among the plurality of photodiodes 621.

Further, the at least one mask 622 may be formed such that a central location of the region which is not masked in the at least one mask 622 is misaligned with a central location of the at least one photodiode.

Thus, the image sensor 620 may perform at least one of auto focusing or depth estimation using the image generated by the at least one photodiode on which the at least one mask 622 is disposed and the images generated by the other photodiodes except for the at least one photodiode among the plurality of photodiodes 621.

Although not illustrated in FIG. 6, the image sensor 620 may further include a plurality of color filters. The plurality of color filters may be located on an upper portion of the plurality of photodiodes 621 and may filter an optical signal passing through the lens 610.

In this case, the plurality of color filters may include at least one of an RGB color filter, a white color filter, or an IR color filter. Particularly, at least one color filter disposed on an upper portion of the at least one mask 622 among the plurality of color filters may be at least one white color filter.

Further, although not illustrated in FIG. 6, the image sensor 620 may further include a plurality of microlenses which are disposed on an upper portion of the plurality of color filters and move an optical signal passing through the lens included in the camera system ahead to each of the plurality of color filters.

MODE FOR INVENTION

While a few exemplary embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

The invention claimed is:

1. An image sensor included in a camera system, the image sensor comprising:
   a plurality of photodiodes, each being configured to process an optical signal passing through a lens included in the camera system; and
   at least one mask configured to be located on an upper portion of at least one photodiode among the plurality of photodiodes and introduce the optical signal passing through an inner region of the lens included in the camera system into the at least one photodiode,
   wherein the at least one photodiode on which the at least one mask is disposed generates a dearer image than images generated by the other photodiodes except for the at least one photodiode among the plurality of photodiodes by processing the optical signal passing through an inner region of the lens.

2. The image sensor of claim 1, wherein the at least one mask blocks the optical signal passing through an outer region of the lens included in the camera system from being introduced into the at least one photodiode.

3. The image sensor of claim 1, wherein the at least one mask is formed such that a masked region covers a region which is not masked.

4. The image sensor of claim 3, wherein the region which is not masked in the at least one mask is formed to have one of a circle, a triangle, a quadrangle, or a polygon.

5. The image sensor of claim 1, wherein the at least one mask is formed such that a central location of a region which is not masked in the at least one mask is misaligned with a central location of the at least one photodiode.

6. The image sensor of claim 5, wherein the image sensor performs at least one of auto focusing or depth estimation using an image generated by the at least one photodiode on which the at least one mask is disposed and images generated by the other photodiodes except for the at least one photodiode among the plurality of photodiodes.

7. The image sensor of claim 1, further comprising:
   a plurality of color filters configured to be disposed on an upper portion of the plurality of photodiodes and filter the optical signal passing through the lens included in the camera system.

8. The image sensor of claim 7, wherein the plurality of color filters comprise at least one of a red-green-blue (RGB) color filter, a white color filter, or an infrared (IR) color filter.

9. The image sensor of claim 7, wherein at least one color filter disposed on an upper portion of the at least one mask among the plurality of color filters is at least one white color filter.

10. The image sensor of claim 7, further comprising:
    a plurality of microlenses, each being configured to be disposed on an upper portion of each of the plurality of color filters and move the optical signal passing through the lens included in the camera system ahead to each of the plurality of color filters.

11. An operation method of an image sensor included in a camera system, the method comprising:
    introducing an optical signal passing through an inner region of a lens included in the camera system into at least one photodiode using at least one mask disposed on an upper portion of the at least one photodiode among a plurality of photodiodes;
    introducing an optical signal passing through the lens included in the camera system into the other photodiodes except for the at least one photodiode among the plurality of photodiodes;
    processing, by the at least one photodiode, the optical signal passing through the inner region of the lens included in the camera system; and
    processing, by the other photodiodes except for the at least one photodiode among the plurality of photodiodes, the optical signal passing through the lens included in the camera system,
    wherein the processing of the optical signal passing through the inner region of the lens included in the camera system comprises:
      processing the optical signal passing through an inner region of the lens to generate, by the at least one photodiode on which the at least one mask is disposed, a clear image than images generated by the other photodiodes except for the at least one photodiode among the plurality of photodiodes.

12. The method of claim 11, wherein the introducing of the optical signal passing through the inner region of the lens included in the camera system into the at least one photodiode comprises:
    blocking, by at least one mask, the optical signal passing through an outer region of the lens included in the camera system from being introduced into the at least one photodiode.

13. The method of claim 11, wherein the at least one mask is formed such that a masked region covers a region which is not masked.

14. The method of claim 13, wherein the region which is not masked in the at eas one mask is formed to have one of a circle, a triangle, a quadrangle, or a polygon.

15. A camera system, comprising:
    a lens configured to introduce an optical signal; and
    an image sensor,
    wherein the image sensor comprises:
    a plurality of photodiodes, each being configured to process an optical signal passing through the lens; and
    at least one mask configured to be located on an upper portion of at least one photodiode among the plurality of photodiodes and introduce the optical signal passing through an inner region of the lens into the at least one photodiode,
    wherein the at least one photodiode on Which the at least one mask is disposed generates a clearer image than images generated by the other photodiodes except for the at least one photodiode among the plurality of photodiodes by processing the optical signal passing through an inner region of the lens.

* * * * *